(12) United States Patent
Zenpo et al.

(10) Patent No.: US 7,980,611 B2
(45) Date of Patent: Jul. 19, 2011

(54) SUBSTRATE HOLDING APPARATUS, SUBSTRATE TRANSFERRING ROBOT EQUIPPED WITH THE SAME, AND SEMICONDUCTOR PRODUCTION APPARATUS

(75) Inventors: Hideharu Zenpo, Fukuoka (JP); Hideo Yamamoto, Fukuoka (JP); Toshiyuki Harada, Fukuoka (JP); Yoshihiro Kusama, Fukuoka (JP); Katsuya Okumura, Tokyo (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 342 days.

(21) Appl. No.: 12/358,902

(22) Filed: Jan. 23, 2009

(65) Prior Publication Data
US 2009/0232631 A1    Sep. 17, 2009

(30) Foreign Application Priority Data

Jan. 24, 2008   (JP) .................................. 2008-013854

(51) Int. Cl.
*B52J 15/02*    (2006.01)

(52) U.S. Cl. ....................... 294/88; 294/103.1

(58) Field of Classification Search .................... 294/1.1, 294/104, 88, 902, 103.1; 414/935, 941
See application file for complete search history.

(56) References Cited

U.S. PATENT DOCUMENTS

| | | | |
|---|---|---|---|
| 6,913,302 B2 * | 7/2005 | Yokota et al. | 294/103.1 |
| 7,611,182 B2 * | 11/2009 | Kim et al. | 294/103.1 |
| 2003/0130759 A1 * | 7/2003 | Kesil et al. | 700/190 |
| 2005/0017529 A1 * | 1/2005 | Rogers et al. | 294/103.1 |
| 2006/0043750 A1 * | 3/2006 | Wirth | 294/103.1 |
| 2007/0216179 A1 * | 9/2007 | Hirooka et al. | 294/103.1 |

* cited by examiner

*Primary Examiner* — Saúl J Rodriguez
*Assistant Examiner* — Stephen Vu
(74) *Attorney, Agent, or Firm* — Westerman, Hattori, Daniels & Adrian, LLP (57) ABSTRACT

A substrate holding apparatus includes a base plate with a two-pronged portion, a holding plate arranged above the base plate, a driving portion provided therebetween, a holding portion formed by a tip end of the two-pronged portion and a tip end of the holding plate, and a guide portion provided at the tip end of the two-pronged portion for guiding a part of the substrate. The driving portion includes an urging means for always urging a basal end side of the holding plate upward, an electric magnetic portion for drawing the holding plate toward the base plate, and a bearing portion arranged at on the tip end side of the base plate. The guide portion has a guide groove which comes into contact with a part of a periphery of the substrate.

15 Claims, 6 Drawing Sheets

SUBSTRATE HOLDING APPARATUS, SUBSTRATE TRANSFERRING ROBOT EQUIPPED WITH THE SAME, AND SEMICONDUCTOR PRODUCTION APPARATUS

This application claims priority under 35 U.S.C. §119 to Japanese Patent Application No. 2008-13854 filed on Jan. 24, 2008, the entire disclosure of which is incorporated herein by reference in its entirety.

TECHNICAL FIELD

The present invention relates to, inter alia, a substrate holding apparatus for holding a substrate mainly for use in a substrate transferring robot for a semiconductor production apparatus or inspection apparatus. It also relates to a substrate transferring robot equipped with the substrate holding apparatus, and a semiconductor production apparatus.

BACKGROUND OF THE INVENTION

The following description sets forth the inventors' knowledge of related art and problems therein and should not be construed as an admission of knowledge in the prior art.

In a semiconductor production apparatus or inspection apparatus (hereinafter collectively referred to as "semiconductor production apparatus"), a substrate transferring robot has been conventionally used to transfer a substrate, such as, e.g., a semiconductor wafer, to a given position. The substrate transferring robot is equipped with a retractable arm having, at its tip end, a substrate mounting portion called "hand fork," "fork," or "end effector" (hereinafter referred to as "hand"). The substrate is transferred to a given position with the substrate mounted on the hand.

On the other hand, for the purpose of improving the yield ratio in a semiconductor production, it has been required that minute particles do not adhere to a substrate in the production steps.

Under the circumstances, in a recent substrate transferring robot, a hand configured to hold only a peripheral portion of a substrate has been used (see Japanese Unexamined Laid-open Patent Publication No. 2002-170862, hereinafter referred to as "Patent Document 1"). This hand is called "edge grip hand" or the like. This hand is configured to make physical contact with only a peripheral portion of a substrate, which causes less adherence of particles of the hand to a substrate. This edge grip hand described in Patent Document 1 has a first contact portion which comes into contact with a periphery of a substrate at the side of the substrate to be attached to a base of the hand of a substrate transferring robot, and second and third contact portions which come into contact with the substrate at the opposite side of the substrate, extended from the base. The second and third contact portions (holding claws) are driven by a driving means equipped on the base of the hand, so that the substrate is held by the first to third contact portions.

The hand as described in Patent Document 1 has the following problems.

The first problem is that the structure is large in planar size and weight of the hand itself. In detail, as described above, the hand disclosed by Patent Document 1 has a first contact portion which comes into contact with a periphery of a substrate on one side of the substrate, second and third contact portions which come into contact with the substrate on the other side of the substrate. Therefore, the length from the first contact portion to the second and third contact portions is required to have at least a size larger than the diameter of the substrate to be held by the hand. This increases the planar size of the hand, which in turn increases the weight of the hand. The hand large in size and weight increases the load and moment of the arm of the substrate transferring robot, which in turn causes deterioration of the arm positional accuracy.

The next problem is that the structure increases the thickness of the hand itself. The hand described in Patent Document 1 is equipped with driving means for realizing the holding operation for holding the sides of the substrate, and a number of parts driven by the driving means to perform the holding operation. This increases the thickness of the hand, which in turn requires increasing of the size of the opening through which the substrates passes when transferring in accordance with the thickness of the hand.

Another problem is that it is hard to invert or stand up the hand. In a semiconductor production apparatus, in some cases, the substrate transferring robot is required to turn over a substrate to, e.g., wash or polish it. Also, in some cases, it is required to transfer a substrate in a state in which the hand of the substrate transferring robot holding the substrate is in an upright position (i.e., in a vertically raised position). To cope with such requests, in some substrate transferring robots, an inversion mechanism for inverting a hand or a standing mechanism for vertically standing a hand is equipped at the tip end portion of the arm. In the hand as described in Patent Document 1, however, since the size and weight of the hand are large, the aforementioned mechanism becomes large. Furthermore, since it is required to inverse the hand large in planar size, the three-dimensional size required for the inversion and/or standing operation becomes large.

Still another problem is that the configuration of the substrate transferred side is limited. In detail, the hand as described in Patent Document 1 is formed into a two-pronged shape extended from the base of the hand. This requires that the configuration of the substrate transferred size (i.e., the side of receiving the substrate) is formed so as to avoid the two-pronged portion of the hand.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

The present invention aims to provide a substrate holding apparatus reduced in size and weight by mainly reducing an entire thickness of a hand.

The present invention also aims to provide a substrate transferring robot equipped with the aforementioned substrate holding apparatus, and a substrate production apparatus.

According to a first aspect of a preferred embodiment of the present invention, a substrate holding apparatus for holding a part of a periphery of a substrate from upper and lower surfaces thereof, comprises:

a thin-plate like base plate with a two-pronged portion at a tip end side thereof;

a holding plate arranged above an upper surface of the base plate with a clearance therebetween;

a driving portion provided in the clearance between the base plate and the holding plate;

a holding portion formed by a tip end of the two-pronged portion of the base plate and a tip end of the holding plate; and a guide portion provided at the tip end of the two-pronged portion of the base plate and configured to guide a part of the substrate, wherein the driving portion includes an urging means for always urging a basal end side of the holding plate upward, an electric magnetic portion arranged near the urging means and configured to attract the basal end side of the holding plate toward the basal end side of the base plate when energized, and a bearing portion arranged at a tip end side of the electric magnetic portion and the urging means, and configured to allow the holding plate to swing up-and-down with respect to the base plate, and wherein the guide portion has a guide groove which comes into contact with upper and lower surfaces and a side surface of a part of a periphery of the substrate.

According to a second aspect of the invention, in the substrate holding apparatus, the guide groove of the guide portion is formed by stacking an upper guide plate and a lower guide plate, with an inward-facing stepped portion formed at one or both of tip ends of the upper and lower guide plates.

According to a third aspect of the invention, in the substrate holding apparatus, the guide portions are arranged symmetrically, relative to a longitudinal center line of the base plate.

According to a fourth aspect of the invention, in the substrate holding apparatus, the electric magnetic portion includes a yoke fixed on the base plate, a winding molded to the yoke, and a magnetic core fixed to the holding plate.

According to a fifth aspect of the invention, in the substrate holding apparatus, the magnetic core is fixed to the holding plate in a state in which a surface of the magnetic core facing to the winding is inclined so as to gradually approach the winding in a direction from the urging means to the bearing portion.

According to a sixth aspect of the invention, in the substrate holding apparatus, at least two windings are arranged in plane and are molded to the yoke.

According to a seventh aspect of the invention, in the substrate holding apparatus, power supply to the winding can be changed to a lower voltage after the magnetic core is attached to the winding.

According to an eighth aspect of the invention, in the substrate holding apparatus, the guide portion is positioned on the same side of the substrate as the holding portion, relative to a center of the substrate.

According to a ninth aspect of the invention, in the substrate holding apparatus, the guide portion is made of fluorine resin.

According to a tenth aspect of the invention, in the substrate holding apparatus, the urging means is a compression spring or a plate spring.

According to an eleventh aspect of the invention, in the substrate holding apparatus, the holding portion is formed by polyetheretherketone (PEEK).

According to a twelfth aspect of the invention, in the substrate holding apparatus, the urging means always urges a tip end side of the holding plate downward, the bearing portion is arranged on the basal end side of the urging means, and the electric magnetic portion is arranged at a basal end side of the bearing portion.

According to a thirteenth aspect of the invention, in the substrate holding apparatus of the twelfth aspect of the invention, the urging means is an extension spring.

According to a fourteenth aspect of the invention, a substrate transferring robot is equipped with the substrate holding apparatus at a tip end of a robot arm.

According to a fifteenth aspect of the invention, in the substrate transferring robot, the substrate holding apparatus is fixed to the tip end of the robot arm with the holding plate facing downward.

According to a sixteenth aspect of the invention, in the substrate transferring robot, a power source for driving the electric magnetic portion and a servo-system power source of a robot main body are shared.

According to a seventeenth aspect of the invention, a semiconductor production apparatus is equipped with the substrate transferring robot.

The present invention has the following effects.

According to the first aspect of the invention, the thin-plate like base plate and the holding plate face each other in the up-and-down direction, and the holding plate is supported in a slightly swingable manner with respect to the base plate about the shaft of the bearing portion, while the holding plate is capable of slightly swinging by the function of the electric magnetic portion and the urging means to hold a substrate. Therefore, the entire thickness of the substrate holding apparatus can be decreased.

Especially, the driving source is the electric magnetic portion, and the urging means, the electric magnetic portion, the bearing portion, and the contact plates are arranged in this order from the basal end side of the base plate, and the basal end side of the holding plate is urged upward. Therefore, it is only required to increase the gap of the contact plates by supplying a current to the winding only immediately before the holding operation of the substrate, which minimizes the electromagnetic power required for the winding. This in turn allows the placing of a thin winding on the base plate, reducing the entire thickness of the substrate holding apparatus.

Furthermore, since the urging means, the electric magnetic portion, the bearing portion, and the contact plates are arranged on the upper surface of the base plate from the basal end side in this order, unless the winding of the electric magnetic portion is energized, the basal end side of the holding plate is always urged upward to close the gap of the contact plates. This structure functions so as not to drop the substrate held by the gap even if the current to the winding is shut down for some reason.

Furthermore, since the guide portion comes into contact with the side surface of the substrate to adjust the center position of the substrate, the substrate can be positioned with respect to the holding portion in a good repeatable manner, resulting in assured holding of the substrate by the holding portion Furthermore, since the centering of the substrate can be performed by the guide function of the guide portion, the structure of the so-called aligner, which is used to perform the centering of a substrate in a semiconductor production apparatus, can be simplified.

Furthermore, since the driving source is the electric magnetic portion, no fluid such as compressed air will be required. An air cylinder is widely used as a hand driving source in a conventional apparatus. Although the conventional hand requires compressed air, no compressed air is required in the substrate holding apparatus according to the present invention.

In some cases, in a semiconductor production apparatus, reduced-pressure environment (vacuum environment) is formed by a chamber and a substrate transferring robot is used therein. However, in the substrate holding apparatus according to the present invention, since the driving force is not compressed air, the apparatus can be used under the reduced-pressure environment.

According to the second aspect of the invention, the guide groove of the guide portion can be easily made by forming an inward-facing stepped portion at the tip end of the upper or lower guide plate and stacking the upper and lower guide plates with the stepped portion.

According to the third aspect of the invention, since the guide portions are arranged symmetrically to a longitudinal center line of the base plate, even if the center of the substrate is slightly shifted when the guide portion approaches the substrate, the substrate is guided by the two grooves of the guide portions so that the virtual center of the groove and the center of the substrate coincide.

According to the fourth aspect of the invention, even if the winding is formed into a thin shape, since it is equipped with a back yoke, the magnetic power can be strengthened, which enables assured holding of the substrate.

According to the fifth aspect of the invention, even if the holding plate is slightly swung at the time of the holding operation, since the surface of the winding and that of the magnetic core are close, the attraction can be maintained by a lower power.

According to the sixth aspect of the invention, since a plurality of windings are arranged in plane, the winding can be decreased in thickness while maintaining the electromagnetic power as compared with the case in which the electric magnetic portion is formed by a single winding, which decreases the thickness of the substrate holding apparatus.

According to the seventh aspect of the invention, by allowing for the power supply to the winding at, for example, 24V, and then changing to 5V after the attraction/approach of the magnetic core to the winding, electricity can be saved and the heat generation from the winding can be restrained by controlling the current passing through the winding.

According to the eight aspect of the invention, the holding portion only holds a part of a periphery of a substrate and that the guide portion extended from the right and left side of the holding portion merely requires the minimum dimension, which enables the centering of the substrate. Therefore, the effects can be obtained even if the guide portion is positioned on the same side of the substrate as the holding portion, relative to the center of the substrate. By forming the guide portion at such position, the planar dimension of the entire substrate holding apparatus can be reduced. That is, it is not required to extend the two-pronged portion from the base of the hand to the portion of the substrate opposite to the portion of the periphery held by the holding portion, as in a conventional hand, resulting in reduced planar dimension.

Furthermore, since the two-pronged portion is not largely extended as explained above, the configuration of the substrate transferred side (i.e., the substrate receiving side) is not required to consider the interference to the two-pronged portion, which results in almost no limitation of the substrate transferred configuration.

According to the ninth aspect of the invention, since the guide portion for guiding the substrate is formed by material excellent in sliding performance and abrasion resistance, it is possible to guide a substrate in a slidable manner while restraining occurrence of particles.

According to the tenth aspect of the invention, the means for urging the basal end side of the holding plate upward can be easily constituted by a compression spring or a plate spring.

According to the eleventh aspect of the invention, since the material with relatively large friction coefficient is used for the holding portion which comes into contact with the upper and lower surfaces of the substrate, the substrate hardly slips with respect to the holding portion, resulting in assured holding.

According to the twelfth aspect of the invention, even in cases where means for always urging the tip end side of the holding plate downward is used as the urging means, the same effects as those obtained in the structure as the first aspect of the invention can be obtained.

According to the thirteenth aspect of the invention, the means for always urging the tip end side of the holding plate downward can be simply constituted by an extension spring.

According to the fourteenth aspect of the invention, since the substrate holding apparatus attached to a hand tip end of a substrate transferring robot can be reduced in thickness and planar dimension, the entire weight of the substrate holding apparatus can be reduced. With this, even if the substrate transferring robot is required to invert a substrate upside down or transfer a substrate with the hand holding the substrate standing up, the three-dimensional size required at the time of the inversion or standing-up operation can be reduced, which can reduce the footprint required for the robot. Furthermore, the reduction of the weight and the planar dimension improves the controllability, which in turn improves the arm positional accuracy.

Furthermore, since the driving source for each portion, such as, e.g., the arm substrate holding apparatus of the substrate transferring robot, is usually a servomotor, and the electric magnetic portion can be driven by a power source of a voltage equal to a voltage to be supplied to a position detector used for the servomotor. Therefore, it is preferable to share the power, which in turn can simplify the structure of the power source of the entire substrate transferring robot.

According to the fifteenth aspect of the invention, since the holding plate is positioned at the lower side of the base plate, it is possible to more effectively prevent particles from the driving portion from adhering to a substrate.

According to the sixteenth aspect of the invention, since a power source can be shared by the robot side, the circuit can be simplified, resulting in a reduced size and reduced cost.

According to the seventeenth aspect of the invention, adherence of particles to a substrate can be reduced during transferring of a substrate, which improves the yield rate of a semiconductor production and reduces the footprint of a substrate transferring robot. This reduces the entire size of a semiconductor production apparatus, which enables wide application to various types of robots.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
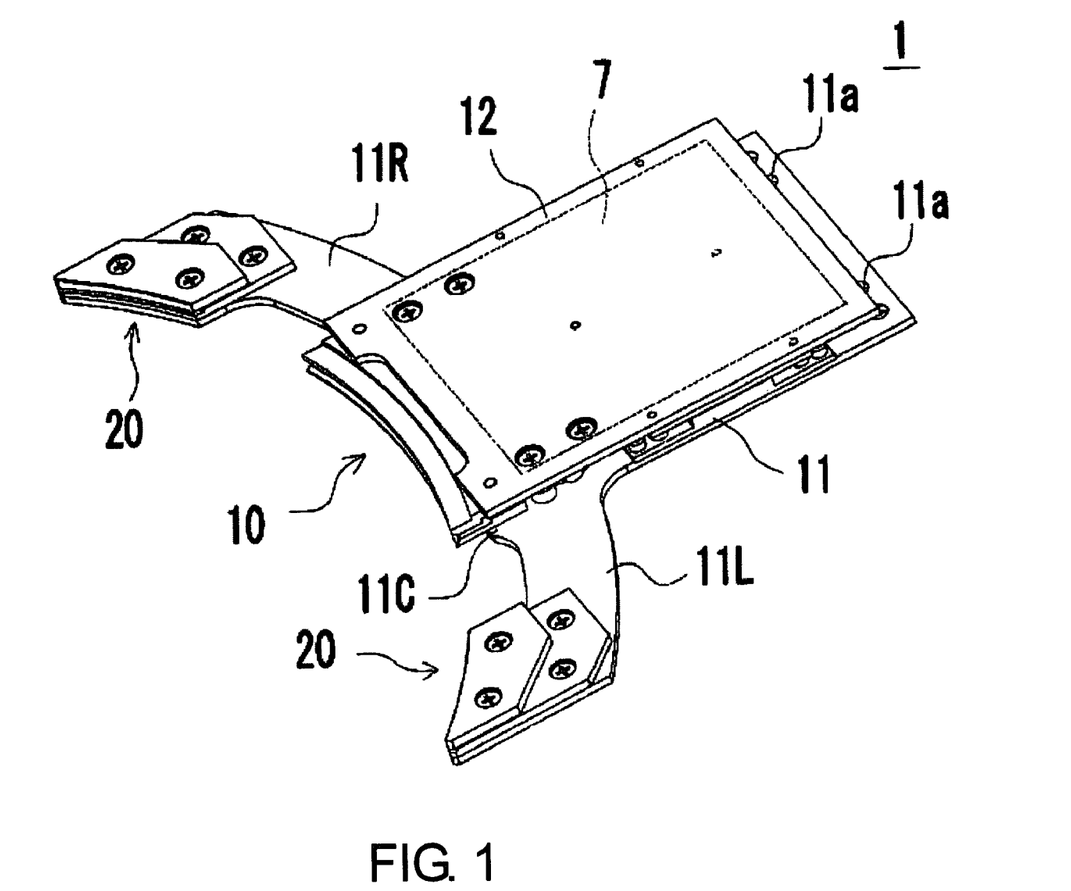
FIG. 1 is a perspective view showing a substrate holding apparatus according to an embodiment of the present invention.
Figure 2:
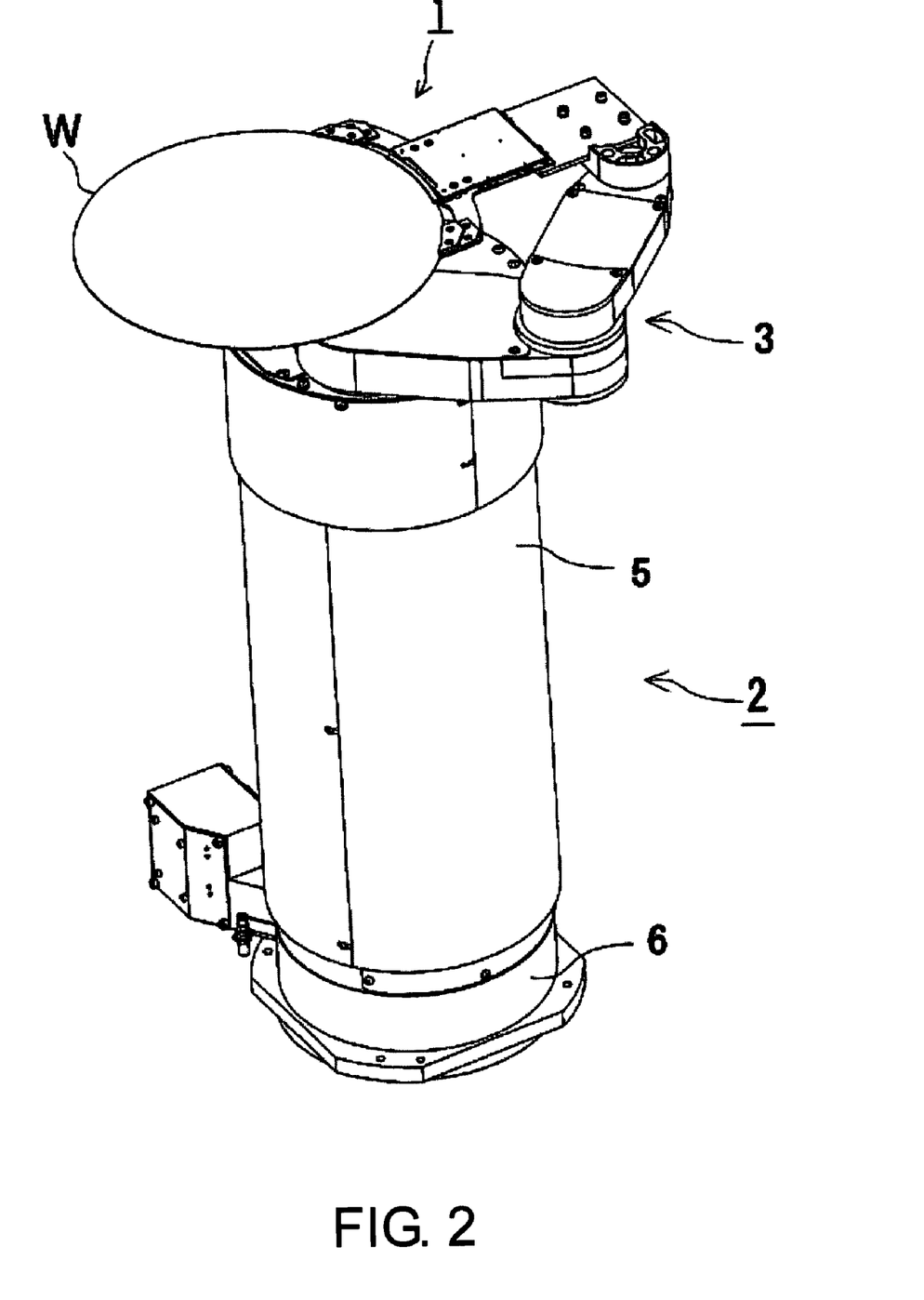
FIG. 2 is a perspective view showing the state in which the substrate holding apparatus shown in FIG. 1 is attached to the tip end of the arm of a substrate transferring apparatus.

FIG. 1 is a perspective view showing a substrate holding apparatus according to a first embodiment of the present invention, and FIG. 2 is a perspective view showing the state in which the substrate holding apparatus shown in FIG. 1 is attached to the tip end of the arm of a substrate transferring apparatus.

As shown in FIG. 1, the substrate holding apparatus 1 includes, as main parts, a holding portion 10 provided at a central tip end of a thin-plate like base plate 11, two guide portions 20 and 20 extended from both sides of the holding portion 10, and a driving portion 7 for driving the holding portion 10. The base plate 11 is made of, e.g., stainless, aluminum, or carbon fiber reinforced plastic (CFRP). The base plate 11 is provided with screw holes 11a or the like at its basal end side (right side in FIG. 1) so that the base plate 11 can be attached to a tip end of an arm 3 of a substrate transferring robot 2 as shown in FIG. 2. The other end (left side in FIG. 1) of the base plate 11 is divided into two fingers 11R and 11L (two-pronged portion) curving along the external periphery of a substrate W. At the tip end of each of the fingers 11R and 11L, the guide portion 20 is provided. Between these guide portions 20 and 20 and at the tip end portion 11C of the fingers of the base plate 11, the holding portion 10 is provided. Above the basal end portion of the base plate 11, a holding plate 12 is provided so as to cover the basal end portion. The holding plate 12 covers the driving portion 7 (see FIG. 5B). The tip end of the holding plate 12 and the tip end 11C of the fingers of the base plate 11 form the holding portion 10, which holds a substrate W from its upper and lower surfaces as shown in FIG. 3.

Figure 3:
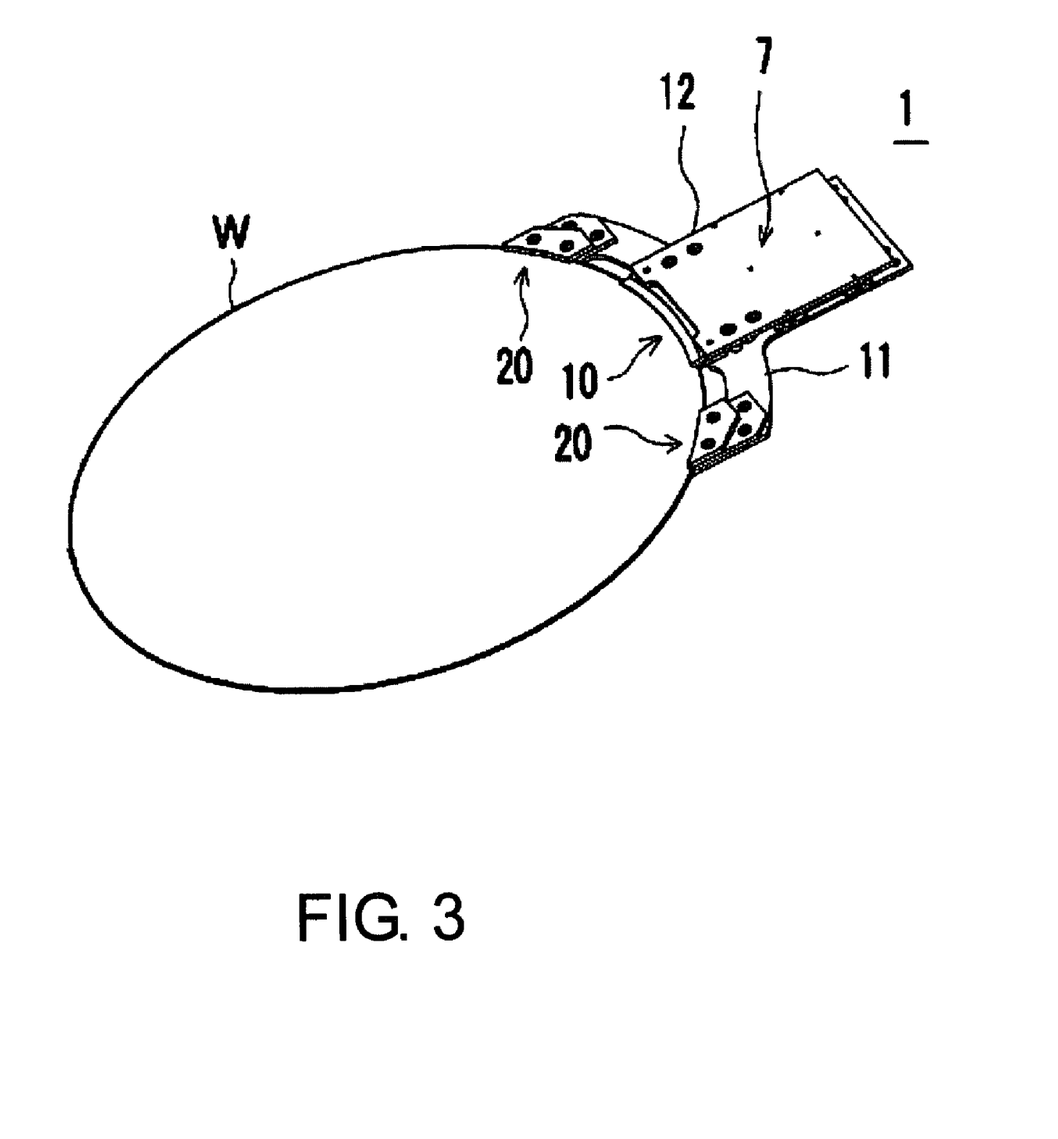
FIG. 3 is a perspective view showing the state in which the substrate holding apparatus shown in FIG. 1 holds a substrate.

FIG. 3 is a perspective view showing the state in which the substrate holding apparatus 1 shown in FIG. 1 holds a substrate W. In FIG. 3, the holding plate 12 is driven by the driving portion 7 to be swung up and down with respect to the base plate 11 so that a substrate W can be held with the holding portion 10. The holding portion 10 pinches a part of a periphery of a substrate W from its upper and lower surfaces. The guide portion 20 is a portion for guiding a substrate W to prevent misalignment so that the substrate W can be held with the holding portion 10.

The driving portion 7 is the driving mechanism for the holding portion 10 and is located at the basal end side of the holding portion 10.

When the substrate holding apparatus 1 comes close to the substrate W by the arm 3 of the substrate transferring robot 2, the upper and lower surfaces of a part of the periphery of the substrate W are held by the holding portion 10 driven by the driving portion 7 while the substrate W is being guided by the two guide portions 20 and 20, so that it can be safely held by the holding portion 10. Thereafter, the substrate W is transferred to a predetermined position by the substrate transferring robot 2.

Hereinafter, the substrate holding apparatus 1 will be detailed.

Initially, the guide portion 20 will be explained with reference to FIGS. 4A and 4B.

Figure 4A:
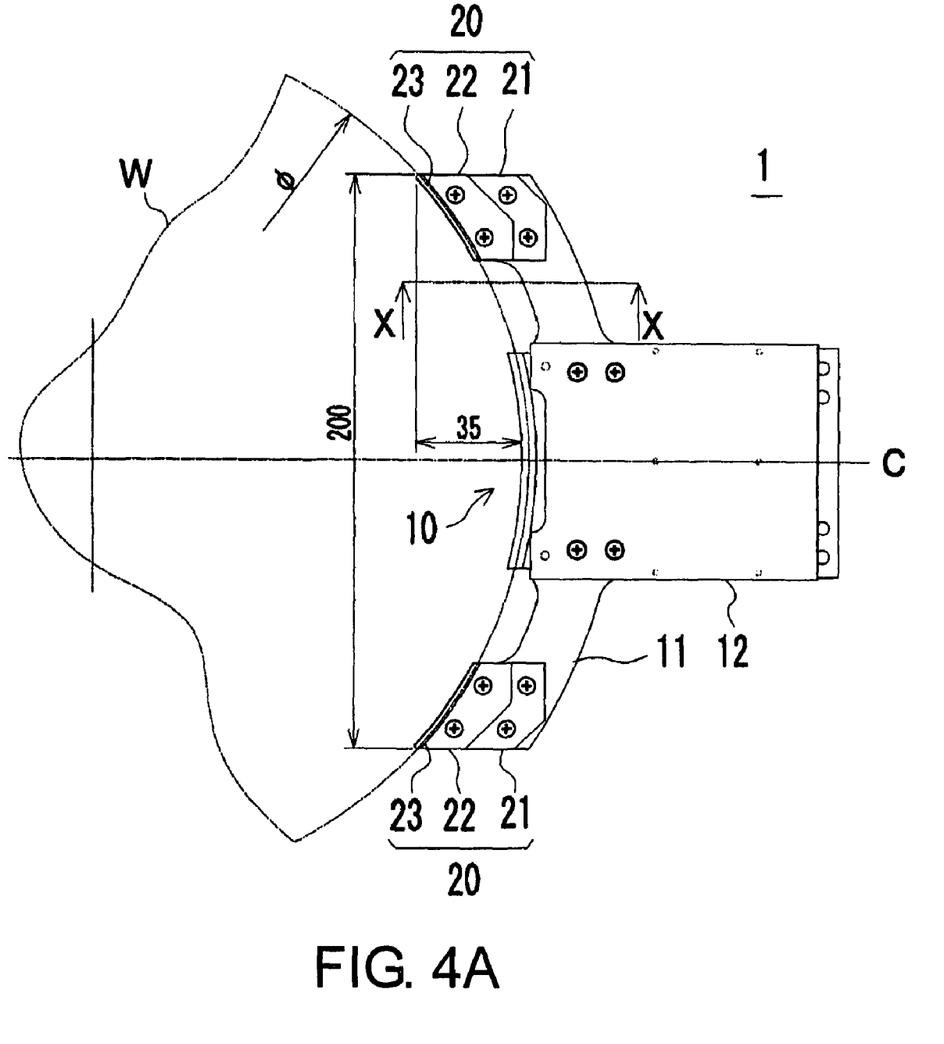
FIG. 4A is an external top view of the substrate holding apparatus shown in FIG. 1.
Figure 4B:
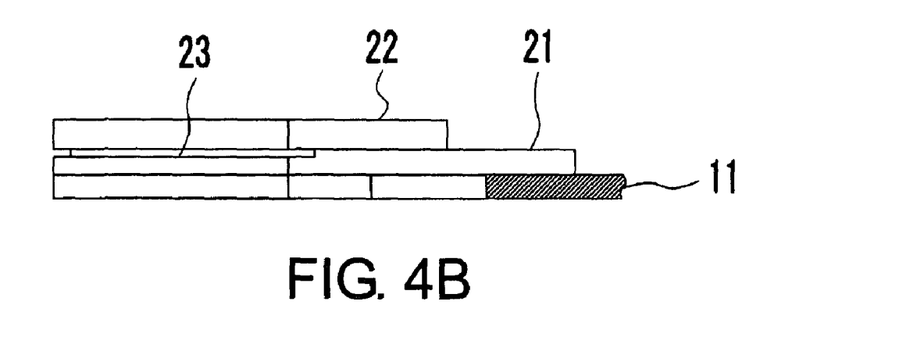
FIG. 4B is an enlarged cross-sectional view taken along the line X-X in FIG. 4B.

FIG. 4A is an external top view of the substrate holding apparatus 1 shown in FIG. 1, and FIG. 4B is an enlarged cross-sectional view taken along the line X-X in FIG. 1.

Two guide portions 20 are the same in structure and symmetrical with respect to the center line C of the substrate holding apparatus 1, and therefore the following explanation will be directed only to one of guide portions. The guide portion 20 includes a lower guide plate 21 and an upper guide plate 22. The lower guide plate 21 is fixed on the tip end portion of the two-pronged portion of the base plate 11. The upper guide plate 22 is fixed on the lower guide plate 21. Between the tip end side of the lower guide plate 21 and that of the upper guide plate 22, a groove 23 which curves along the external periphery of the substrate W is formed. The groove 23 comes into contact with the upper and lower surfaces of a part of the periphery of the substrate W and the side surface thereof to control the position of the substrate W such that the central position of the substrate W is not misaligned with respect to the holding portion 10. Since two guide portions 20 and 20 are symmetrical with respect to the center line C, when the substrate W comes close to the grooves 23 and 23 from the tip end side of the substrate holding apparatus 1, even in cases where the center of the substrate W is slightly misaligned with respect to the center line C of the holding plate 10, the substrate W will be guided by the two grooves 23 and 23 so that the virtual center formed by the grooves 23 and 23 coincides with the center of the substrate W. The virtual center formed by the grooves 23 and 23 is set to the position where the holding portion 10 can assuredly hold the substrate W.

For example, as shown in FIG. 4A, in the case where the substrate W is a wafer 300 mm in diameter, the width of the upper and lower guide plates 21 and 22 of the substrate holding apparatus 1 is about 200 mm, and each guide plate is protruded from the tip end portion of the holding portion 10 by about 35 mm. These dimensions are set such that the length is long enough to guide the substrate W so that the holding portion 10 can assuredly hold the substrate W, and are limited such that the guide portion 20 does not protrude excessively from the basal end side of the substrate holding apparatus 1. That is, the guide portion 20 is positioned so that it is located on the same side of the substrate as the holding portion 10, relative to the center of the substrate W in a state in which the substrate holding apparatus 1 holds the substrate W. As explained above, the substrate holding apparatus 1 of the present invention is not configured such that the two-pronged portion holds the opposite side of the substrate W as the base portion, as in the conventional hand.

Furthermore, the lower guide plate 21 and the upper guide plate 22 are members for slidably guiding the substrate W, and therefore they are preferably made of material excellent in slide performance and abrasion resistance, for example, fluorine resin such as polytetrafluoroethylene (PTFE).

Next, the holding portion 10 and the driving portion 7 will be explained with reference to FIGS. 5A and 5B.

Figure 5A:
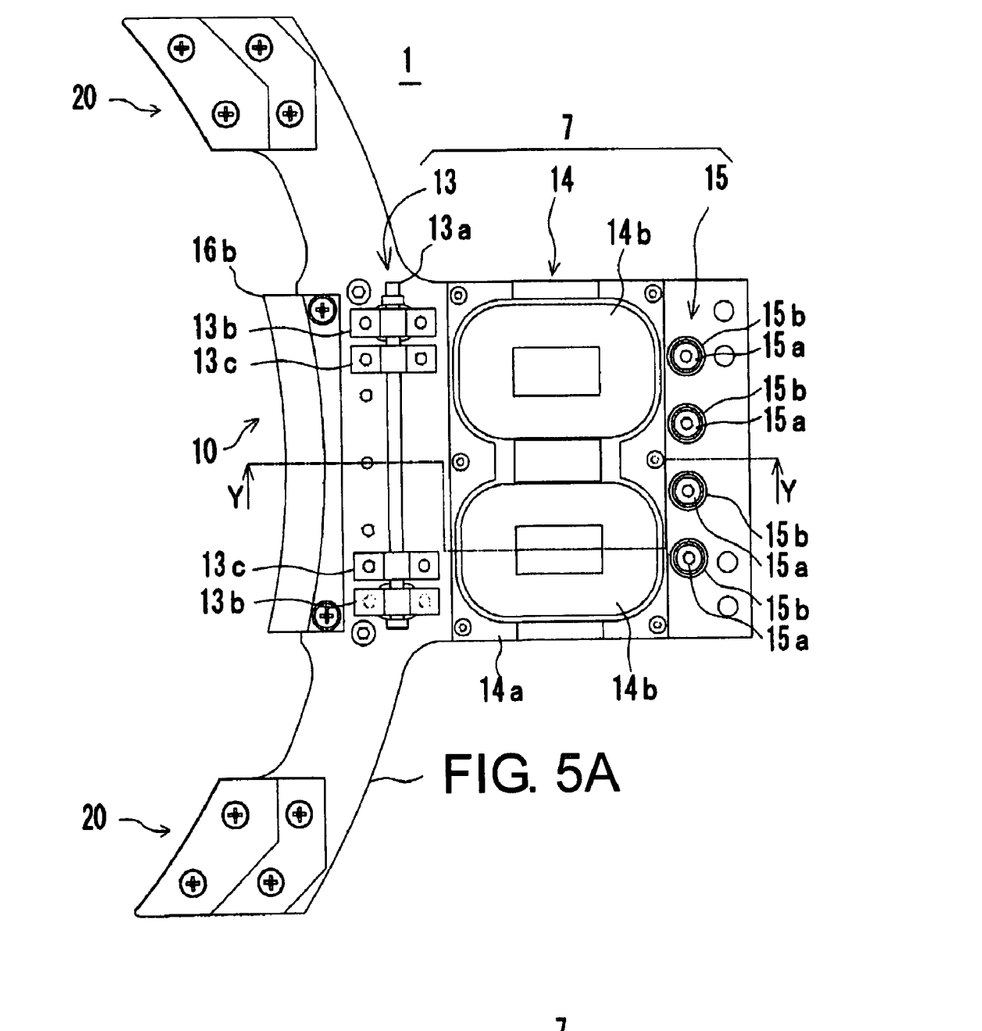
FIG. 5A is a top view of the substrate holding apparatus shown in FIG. 1 from which a holding plate and an absorption core are removed.

FIG. 5A is a top view of the substrate holding apparatus 1 shown in FIG. 1 from which a holding plate and a magnetic core are removed. FIG. 5B is a cross-sectional side view of the substrate holding apparatus 1 shown in FIG. 1 corresponding to a cross-sectional view taken along the line Y-Y in FIG. 5A, in which the holding plate and the magnetic core are shown.

The driving portion 7 includes a bearing portion 13, an electric magnetic portion 14, and urging means 15. The holding portion 10 includes upper and lower contact plates located at the tip end of the basal end portion of the two-pronged portion of the base plate 11 and the tip end of the holding plate 12 respectively (i.e., a lower contact plate 16a and an upper contact plate 16b).

The holding plate 12 is a thin-plate like member of a generally rectangular shape as shown in FIGS. 1, 4A and 4B. The holding plate 12 is arranged at an upper side of the base plate 11 so as to hold the driving portion 7 including the bearing portion 13 and the electric magnetic portion 14 between the holding plate 12 and the base plate 11. The holding plate 12 is connected to and supported by the holding plate side shaft receiver 13c (see FIG. 5A) of the bearing portion 13.

Figure 5B:
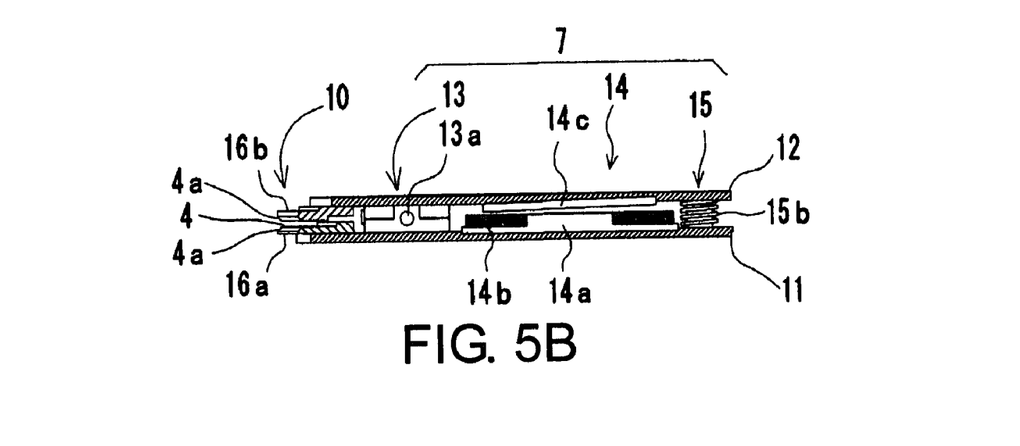
FIG. 5B is a cross-sectional side view of the substrate holding apparatus shown in FIG. 1 corresponding to a cross-sectional view taken along the line Y-Y in FIG. 5A.

As shown in FIGS. 5A and 5B, a plurality of urging means 15 are provided at the basal end side (right side in FIGS. 5A and 5B) of the base plate 11 and the holding plate 12. Each urging means 15 includes a core member 15a (see FIG. 5A) and a compression spring 15b (see FIG. 5B) surrounding the core member 15a As shown in FIG. 5B, the core member 15a is vertically upwardly disposed on the base plate 11 and holds the compression spring 15b therearound. With this compression spring 15b, the basal end side of the holding plate 12 is always urged upward as shown in FIG. 5B.

The urging means 15 can be constituted by, for example, a plate spring in place of the compression spring as long as it always urges the basal end side of the holding plate 12 upward.

At the tip end side (left side in FIGS. 5A and 5B) of the urging means 15, the electric magnetic portion 14 is provided. This electric magnetic portion 14 includes a yoke 14a, a winding 14b, a magnetic core 14c. The yoke 14a is a thin-plate like member having nearly the same width as the width of the base plate 11 as shown in FIG. 5A. The yoke 14a is formed by a 3% silicon steel plate and serves to enhance the electromagnetic power of the winding 14b. The winding 14b includes, in this embodiment, two windings of a thin type arranged on the yoke 14a in a plane. These two windings 14b are molded by resin curing agent to be integrally fixed to the yoke 14a To the winding 14b, electric current is supplied via lead wires (not illustrated). The magnetic core 14c is fixed to the holding plate 12 so as to form a minute gap between the molded winding 14b and the core 14c. The magnetic core 14c is a thin-plate like member of a rectangular shape and has almost the same area as the area of the yoke 14a shown in FIG. 5A. This magnetic core 14 is also formed by a 3% silicon steel plate. Therefore, when a prescribed current is supplied to the winding 14b, the winding 14b causes attraction of the magnetic core 14c. The magnetic core 14c is fixed to the holding plate 12 in an inclined manner such that the lower surface of the magnetic core 14c facing to the winding 14b gradually approaches the upper surface of the winding 14b from the side of the urging means 15 toward the side of the bearing portion 13, so that the upper surface of the winding 14b and the lower surface of the magnetic core 14c closely contact with each other when the magnetic core 14c is attached to the winding 14b. Since the magnetic core 14c itself is a thin plate having upper and lower surfaces in parallel with each other, the magnetic core 14c is attached to the holding plate 12 in an inclined manner with the urging means side thereof embedded in the holding plate 12 as shown in FIG. 5B. With this, the magnetic core 14c can come in close contact with the winding 14b without causing a gap therebetween when the magnetic core 14c is slightly swung together with the holding plate 12 about the bearing portion 13 as a fulcrum.

As shown in FIGS. 5A and 5B, at the tip end side (left side in FIG. 5) of the electric magnet portion 14, the bearing portion 13 is provided. The bearing portion 13 includes a shaft 13a, base plate side shaft receivers 13b, and holding plate side shaft receivers 13c. The shaft 13a is a bar-shaped member. The base plate side shaft receiver 13b and the holding plate side shaft receiver 13c are a block shaped members respectively, and a total of four shaft receivers, two base plate side shaft receivers 13b and two holding plate side shaft receivers 13c, are provided. On the upper surface of the base plate 11, two base plate side shaft receivers 13b are fixed. On the holding plate 12, two holding plate side shaft receivers 13c are fixed. The two base plate side shaft receivers 13b are provided so as to stand face to face across the center line C shown in FIG. 4A. In the same manner, two holding plate side shaft receivers 13c are provided. These four shaft receivers 13b and 13c each have a through-hole through which a shaft 13a is rotatably inserted. With this, the shaft 13a is disposed perpendicular to the center line C.

With this bearing portion 13, the holding plate 12 is supported by the holding plate side shaft receiver 13c. Therefore, the holding plate 12 is able to slightly swing up and down about the shaft 13a with the basal end side always urged upward by the compression spring 15b. In place of the above, it can be configured such that the shaft 13a is rotatably supported by a bearing held in the through-hole of the shaft receiver.

At the tip end side of the bearing portion 13, contact plates forming the holding portion 10 is provided. The contact plates include a lower contact plate 16a fixed to the tip end of the base plate 11, and an upper contact plate 16b fixed to the tip end of the holding plate 12. At the tip end side of each of the upper and lower contact plates, a stepped portion formed to have a configuration slightly larger than an external periphery of the substrate W is formed so as to face with each other. These two stepped portions face in an up-and-down direction, and form a gap 4 for inserting the substrate W. Each end portion of the lower and upper contact plates 16a and 16b forming the gap 4 is formed into an inclination 4a to facilitate the insertion of the substrate W into the gap 4. The lower and upper contact plates 16a and 16b are made of material relatively large in friction coefficient, such as, e.g., polyetheretherketone (PEEK).

Now, the operation of the aforementioned substrate holding apparatus 1 will be explained with reference to FIGS. 6A to 6D. FIGS. 6A to 6D are schematic cross-sectional side views for explaining the operation of the substrate holding apparatus 1 for holding a substrate W.

Figure 6A:
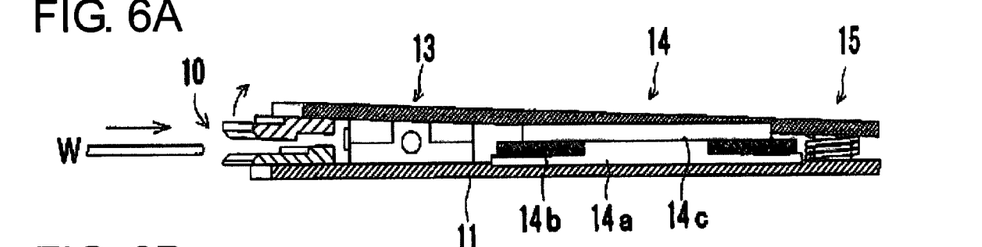
FIGS. 6A to 6D are schematic cross-sectional side views showing the operation of the substrate holding apparatus shown in FIG. 1 for holding a substrate.

(1) Initially, the substrate holding apparatus 1 attached to the tip of the arm 3 of the substrate transferring robot 2 (see FIG. 2) approaches the substrate W as shown in FIG. 6A. At this time, current is supplied to the winding 14b of the electric magnetic portion 14. As a result, the magnetic core 14a is drawn toward the winding 14b of the electric magnetic portion 14 against the function of the compression spring 15b of the urging means 15. With this, the basal end side (right side in FIG. 6A) of the holding plate 12 goes down with respect to the base plate 11 and the tip end side (left side in FIG. 6A) of the holding plate 12 goes up with respect to the base plate 11 about the shaft 13a of the bearing portion 13. Thus, the gap 4 between the contact plates 16a and 16b expands to be slightly larger than the thickness of the substrate W.

After the attraction between the winding 14b and the magnetic core 14c, a large current will be no longer required to keep the attraction. Therefore, from the view point of energy saving, it is preferable to change the power feeding to the winding 14b from a high voltage to a low voltage sufficient to maintain the attraction.

(2) When the substrate holding apparatus 1 further approaches the substrate W, the side surface of the substrate W comes into contact with the groove 23 (see FIG. 4B), whereby the substrate W is slightly guided so that the virtual center of the groove 23 and the center of the substrate W coincides. At this time, the substrate W is positioned in the gap 4. Needless to say, in the case where the operation of the arm 3 is accurate and the substrate W is exactly positioned at the target position, the aforementioned minute guiding by the guide portion 20 does not occur.

Figure 6B:
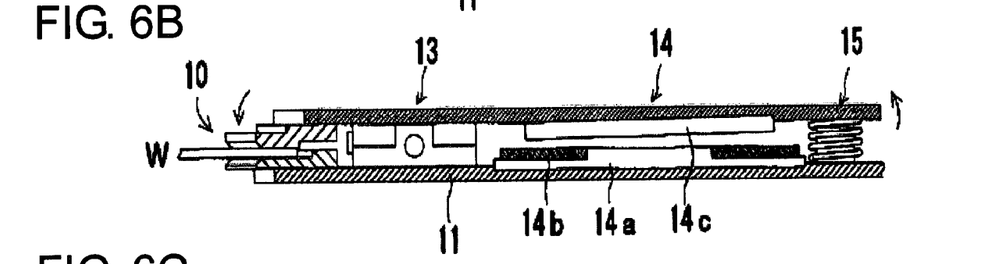
Figure 6C:
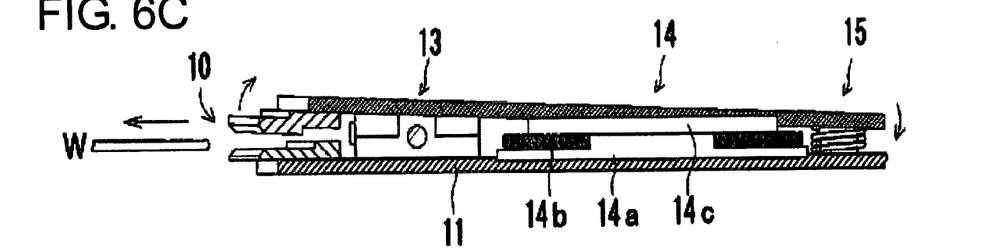

(3) Next, as shown in FIG. 6B, when the current supply to the winding 14b of the electric magnet portion 14 is shut off, the attraction between the winding 14b and the magnetic core 14c goes off. As a result, the function of the compression spring 15b of the urging means 15 causes an upward movement of the basal end side of the holding plate 12 with respect to the base plate 11 and a downward movement of the tip end side of the holding plate 12 with respect to the base plate 11 about the shaft 13a of the bearing portion 13. Thus, the gap 4 between the contact plates at the holding portion 10 becomes narrow, so that the substrate W is held by the upper and lower contact plates. Thereafter, the substrate W held by the substrate holding apparatus 1 is transferred to a target position by the operation of the arm 3.

(4) Next, after the transferring of the substrate W to the target position, a current is supplied to the winding 14b of the electric magnet portion 14, which increases the gap 4 of the holding portion 10 to release the holding of the substrate W.

Figure 6D:
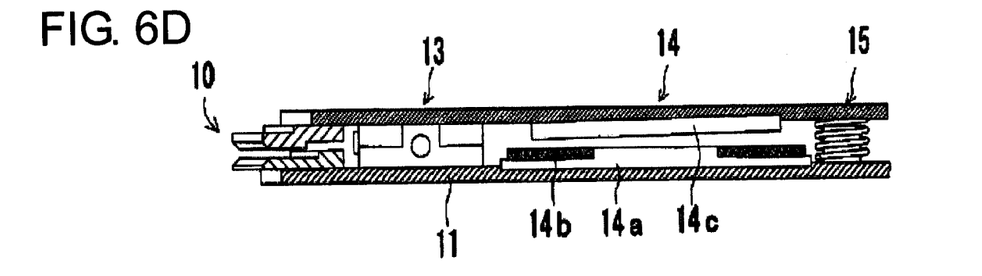

(5) In cases where the substrate holding apparatus 1 is not required to hold the substrate W as shown in FIG. 6D, no current is supplied to the winding 14b and therefore the gap is kept closed.

According to the substrate holding apparatus of the present invention explained above, the thin-plate like base plate 11 and the holding plate 12 face each other in the up-and-down direction, and the holding plate 12 is supported in a slightly swingable manner with respect to the base plate 11 about the shaft 13a of the bearing portion 13, while the holding plate 12 is capable of swinging by the function of the electric magnetic portion 14 to hold a substrate W. Therefore, the entire thickness of the substrate holding apparatus 1 can be decreased. Especially, the driving source is the electric magnetic portion 14, and the urging means 15, the electric magnetic portion 14, the bearing portion 13, and the contact plates are arranged in this order from the basal end side of the base plate 11. Furthermore, the basal end side of the holding plate 12 is urged upward. It is only required to increase the gap 4 of the contact plates by supplying a current to the winding 14 only immediately before the holding operation of the substrate W, which enables to minimize the electromagnetic power required for the winding 14b. This in turn allows the placing of a thin winding 14b on the base plate 11, reducing the entire thickness of the substrate holding apparatus.

Furthermore, since the driving force is the electric magnetic portion 14, the power supply to the winding 14b can be performed at, for example, 24V, and then changed to 5V after the attraction/approach of the winding 14b and the magnetic core 14c to save electricity and restrain the heat generation from the winding 14b by controlling the current passing through the winding 14b. In other words, the power supply to the winding 14b is performed at the time of widening the gap 4. After the attraction/approach of the winding 14b and the magnetic core 14c, however, the current required to hold the attraction state decreases. Therefore, even if the voltage 24V applied at the time of the driving is changed into a low voltage, e.g., 5V, it is possible to hold the electromagnetic power required for the attraction of the magnetic core 14c to the winding 14b.

Furthermore, the holding portion 10 only holds a part of the periphery of the substrate W from its upper and lower sides, and the guide portion extended from the right and left side of the holding portion 10 merely requires the minimum dimension required to perform the centering guide of the substrate W, which can reduce the entire planar dimension of the substrate holding apparatus 1. That is, it is not required to extend the two-pronged portion from the base of the hand to the portion of the substrate W opposite to the portion of the periphery held by the holding portion 10, as in a conventional hand, resulting in a reduced planar dimension.

Furthermore, since the two-pronged portion is not largely extended as explained above, the configuration of the substrate transferred side (i.e., the substrate receiving side) is not required to consider the interference to the two-pronged portion, which results in almost no limitation of the substrate transferred side configuration.

As mentioned above, since the thickness and the planar dimension can be decreased, the entire weight of the substrate holding apparatus 1 can be reduced. With this, even if it is required for the substrate transferring robot to invert the hand holding a substrate W upside down or to transfer the hand holding a substrate W with the hand standing upright, the three-dimensional size required for the inversion or standing operation becomes small, which can reduce the footprint of the semiconductor production apparatus.

Furthermore, since the urging means 15, the electric magnetic portion 14, the bearing portion 13, and the contact plates are arranged on the upper surface of the base plate 11 from the basal side in this order, unless the winding 14b of the electric magnetic portion 14 is energized, the basal end side of the holding plate 12 is always urged upward to close the gap 4 of the contact plates. This structure functions so as not to drop the substrate W held by the gap 4 even if the current to the winding 14b is shut down for some reason.

Furthermore, since the guide portion 20 comes into contact with the side surface of the substrate W to adjust the center position of the substrate W, the substrate W can be positioned with respect to the holding portion 10 in a good repeatable manner, resulting in assured holding of the substrate W by the holding portion 10. Furthermore, since the centering of the substrate W can be performed by the guide function of the guide portion 20, the structure of the so-called aligner, which is used to perform the centering of a substrate in a semiconductor production apparatus, can be simplified.

Furthermore, since the driving source is the electric magnetic portion 14, no fluid such as compressed air will be required. That is, an air cylinder is widely used as a hand driving source in a conventional apparatus. Although the conventional apparatus requires compressed air, no compressed air is required in the substrate holding apparatus 1 according to the present invention.

In some cases, in a semiconductor production apparatus, reduced-pressure environment (vacuum environment) is formed by a chamber and a substrate transferring robot is used therein. However, in the substrate holding apparatus 1 according to the present invention, since the driving force is not compressed air, the apparatus can be used under the reduced-pressure environment.

Furthermore, the driving source for each portion, such as, e.g., the arm 3 of the substrate transferring robot 2 is usually a servomotor, and the electric magnetic portion 14 can be driven by a power source of a voltage equal to a voltage to be supplied to a position detector used for the servomotor. Therefore, it is preferable to share the power.

In the substrate holding apparatus 1 explained above, the explanation is directed to the structure in which the urging means 15, the electric magnetic portion 14, the bearing portion 13, and the contact plates are arranged on the upper surface of the base plate 11 from the basal side in this order. However, even in the structure in which the compression spring 15*b* of the urging means 15 is replaced by an extension spring, and the electric magnetic portion 14, the bearing portion 13, the urging means 15, and the contact plates are arranged on the upper surface of the base plate 11 from the basal side in this order, the same effects as mentioned above can be obtained.

Furthermore, it can be configured such that the substrate holding apparatus 1 of the present invention is attached to the tip end of the arm 3 upside down. In detail, in the substrate holding apparatus 1 explained above, it is configured such that the basal end side of the base plate 11 is attached to the tip of the arm 3 and that the holding plate 12 is operated at the upper side of the base plate 11. Instead of the above structure, it can be configured such that the holding plate 12 is provided at the lower side of the base plate 11 and that the holding plate 12 is operated at the lower side of the base plate 11.

Furthermore, in the substrate transferring robot 2 shown in FIG. 2, it is configured such that the cylindrical body 5 moves up and down with respect to the base 6 and that a pair of arms 3 mounted on the upper portion of the body 5 extends/retracts and rotates with respect to the body 5. However, the present invention is not limited to this. For example, a substrate transferring robot having a traveling apparatus so that the substrate transferring robot itself shown in FIG. 2 can travel, a substrate transferring robot of a dual-arm type having two pairs of arms 3, or a substrate transferring robot with a box-shaped body 5, is also a substrate transferring robot to which the substrate holding apparatus 1 of the present invention can be applied. Furthermore, a robot in which a plurality of substrate holding apparatuses 1 of the present invention are equipped at the tip end of the arm 3 in a multiple-stage manner in the up-and-down direction, or a robot in which the arm 3 is of a straight sliding type, not of a multi-joint type as shown in FIG. 2, is also a substrate transferring robot to which the substrate holding apparatus 1 of the present invention can be applied.

Furthermore, although FIG. 2 shows only the main body of the substrate transferring robot 2, needless to say, the substrate transferring robot includes a controller (not illustrated) for controlling the operation of the robot.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A substrate holding apparatus for holding a part of a periphery of a substrate from upper and lower surfaces of the substrate, the substrate holding apparatus comprising:
   a thin-plate base plate with a two-pronged portion at a tip end side thereof;
   a holding plate spaced from said base plate with a clearance therebetween;
   a driving portion provided in said clearance formed between said base plate and said holding plate;
   a holding portion formed by a tip end of said two-pronged portion of said base plate and a tip end of said holding plate; and
   a guide portion provided at said tip end of said two-pronged portion of said base plate and configured to guide a part of the substrate,
   wherein said driving portion includes:
      an urging means for always urging a basal end side of said holding plate away from a basal end side of said base plate,
      an electric magnetic portion arranged near said urging means and configured to attract said basal end side of said holding plate toward said basal end side of said base plate when energized, and
      a bearing portion arranged nearer to said tip end of said base plate and said holding plate than said electric magnetic portion and said urging means, and constructed to allow said holding plate to swing up-and-down with respect to said base plate, and wherein said guide portion has a guide groove which comes into contact with the upper and lower surfaces and a side surface of the part of the periphery of the substrate.

2. The substrate holding apparatus as recited in claim 1, wherein said guide groove of said guide portion is formed by stacking an upper guide plate and a lower guide plate on said holding plate and said base plate, respectively, and wherein an inward-facing stepped portion is formed at one or both tip ends of said upper and lower guide plates.

3. The substrate holding apparatus as recited in claim 1, wherein said substrate holding apparatus includes at least two guide portions, said at least two guide portions being arranged symmetrically, relative to a longitudinal center line of said base plate.

4. The substrate holding apparatus as recited in claim 1, wherein said electric magnetic portion includes a yoke fixed on said base plate, a winding molded to the yoke, and a magnetic core fixed to said holding plate.

5. The substrate holding apparatus as recited in claim 4, wherein said magnetic core is fixed to said holding plate such that, in a non-energized state, a surface of said magnetic core facing said winding is inclined so as to gradually approach said winding in a direction from said urging means to said bearing portion.

6. The substrate holding apparatus as recited in claim 4, wherein at least two windings are co-planar and are molded to said yoke.

7. The substrate holding apparatus as recited in claim 4, wherein power supplied to the winding can be changed to a lower voltage after said magnetic core is attracted to said winding.

8. The substrate holding apparatus as recited in claim 1, wherein said guide portion is positioned on a same side of the substrate as the holding portion, relative to a center of the substrate.

9. The substrate holding apparatus as recited in claim 1, wherein said guide portion is made of fluorine resin.

10. The substrate holding apparatus as recited in claim 1, wherein said urging means is a compression spring or a plate spring.

11. The substrate holding apparatus as recited in claim 1, wherein said holding portion is formed by polyetheretherketone (PEEK).

12. A substrate transferring robot equipped with the substrate holding apparatus as recited in claim 1 at a tip end of a robot arm.

13. The substrate transferring robot as recited in claim 12, wherein said substrate holding apparatus is fixed to said tip end of said robot arm with said holding plate facing downward.

14. A substrate holding apparatus for holding a part of a periphery of a substrate from upper and lower surfaces of the substrate, the substrate holding apparatus comprising:

a thin-plate base plate with a two-pronged portion at a tip end side thereof;

a holding plate spaced from said base plate with a clearance therebetween;

a driving portion provided in said clearance formed between said base plate and said holding plate;

a holding portion formed by a tip end of said two-pronged portion of said base plate and a tip end of said holding plate; and a guide portion provided at said tip end of said two-pronged portion of said base plate and configured to guide a part of the substrate, wherein said driving portion includes:

an urging means for always urging said tip end side of said holding plate towards said tip end side of said base plate, a bearing portion constructed to allow said holding plate to swing up-and-down with respect to said base plate, and an electric magnetic portion arranged on a base end side of said bearing portion and configured to attract said tip end side of said holding plate toward said tip end side of said base plate when energized, wherein said bearing portion is arranged between said electric magnetic portion and said urging means, and wherein said guide portion has a guide groove which comes into contact with the upper and lower surfaces and a side surface of the part of the periphery of the substrate.

15. The substrate holding apparatus as recited in claim 14, wherein said urging means is an extension spring.

* * * * *